United States Patent
Sawabe et al.

(10) Patent No.: US 9,425,432 B2
(45) Date of Patent: Aug. 23, 2016

(54) ORGANIC ELECTROLUMINESCENT ELEMENT AND LIGHT EMITTING DEVICE WITH OPTICAL PATH CONTROL LAYER

(71) Applicant: Kabushiki Kaisha Toshiba, Minato-ku (JP)

(72) Inventors: Tomoaki Sawabe, Sumida (JP); Tomio Ono, Yokohama (JP); Toshiya Yonehara, Fukuoka (JP); Shintaro Enomoto, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/644,813

(22) Filed: Mar. 11, 2015

(65) Prior Publication Data

US 2015/0188094 A1    Jul. 2, 2015

Related U.S. Application Data

(63) Continuation of application No. PCT/JP2013/004804, filed on Aug. 8, 2013.

(30) Foreign Application Priority Data

Sep. 25, 2012   (JP) .................................. 2012-211420

(51) Int. Cl.
*H01L 51/52* (2006.01)
*H01L 51/50* (2006.01)

(52) U.S. Cl.
CPC ........ *H01L 51/5275* (2013.01); *H01L 51/5012* (2013.01); *H01L 51/5265* (2013.01)

(58) Field of Classification Search
CPC ............ H01L 51/5275; H01L 51/5012; H01L 51/5265
See application file for complete search history.

(56) References Cited

U.S. PATENT DOCUMENTS

| | | |
|---|---|---|
| 8,283,858 B2 | 10/2012 | Yonehara |
| 8,841,656 B2 | 9/2014 | Sugizaki et al. |
| 8,884,278 B2 | 11/2014 | Yonehara et al. |
| 8,902,383 B2 | 12/2014 | Sugi et al. |
| 8,963,414 B2 | 2/2015 | Sawabe et al. |

(Continued)

FOREIGN PATENT DOCUMENTS

| | | |
|---|---|---|
| EP | 1 411 561 A2 | 4/2004 |
| JP | 2005-276803 A | 10/2005 |

(Continued)

OTHER PUBLICATIONS

Combined Office Action and Search Report issued on Sep. 23, 2015 in Taiwanese Patent Application No. 102129474 with English translation.

(Continued)

*Primary Examiner* — Mamadou Diallo
(74) *Attorney, Agent, or Firm* — Oblon, McClelland, Maier & Neustadt, L.L.P

(57) ABSTRACT

According to one embodiment, an organic electroluminescent element includes a first electrode, a second electrode provided opposite to the first electrode, an organic light emitting layer provided between the first electrode and the second electrode, and a protrusion. The protrusion is provided at least one of between the first electrode and the organic light emitting layer and between the organic light emitting layer and the second electrode.

18 Claims, 10 Drawing Sheets

(56) References Cited

U.S. PATENT DOCUMENTS

| | | | |
|---|---|---|---|
| 2001/0009351 | A1 | 7/2001 | Hosokawa et al. |
| 2002/0022148 | A1 | 2/2002 | Yudasaka |
| 2005/0127832 | A1 | 6/2005 | Toguchi et al. |
| 2005/0285508 | A1* | 12/2005 | Murayama .......... H01L 27/3211 313/503 |
| 2005/0285509 | A1 | 12/2005 | Funamoto et al. |
| 2008/0238297 | A1 | 10/2008 | Oota |
| 2010/0078629 | A1 | 4/2010 | Yokoyama et al. |
| 2011/0140151 | A1 | 6/2011 | Lee et al. |
| 2011/0148290 | A1 | 6/2011 | Oota |
| 2011/0180835 | A1 | 7/2011 | Ono et al. |
| 2011/0204339 | A1* | 8/2011 | Dobbs .................... C09K 11/06 257/40 |
| 2012/0228591 | A1 | 9/2012 | Sawabe et al. |
| 2012/0229020 | A1 | 9/2012 | Yonehara et al. |
| 2012/0241771 | A1 | 9/2012 | Kato et al. |
| 2013/0249384 | A1 | 9/2013 | Sawabe et al. |
| 2014/0077204 | A1 | 3/2014 | Saito et al. |
| 2014/0140047 | A1 | 5/2014 | Sawabe et al. |

FOREIGN PATENT DOCUMENTS

| | | |
|---|---|---|
| JP | 2007-538363 A | 12/2007 |
| JP | 2010-80738 A | 4/2010 |
| JP | 2010-157424 A | 7/2010 |
| JP | 2010-157524 A | 7/2010 |
| JP | 2010-198974 A | 9/2010 |
| JP | 2011-124208 A | 6/2011 |
| JP | 2012-160473 A | 8/2012 |
| JP | 2014-059531 A | 4/2014 |
| JP | 2014-067503 A | 4/2014 |
| JP | 2014-078499 A | 5/2014 |
| JP | 2014-082198 A | 5/2014 |
| JP | 2014-103008 A | 6/2014 |
| KR | 10-2011-0134174 A | 12/2011 |
| TW | I259023 B | 7/2006 |
| TW | 200950174 A1 | 12/2009 |
| WO | WO 2010/140097 A1 | 12/2010 |
| WO | WO 2011/111629 A1 | 9/2011 |
| WO | WO 2014/045574 A1 | 3/2014 |
| WO | WO 2014/045575 A1 | 3/2014 |
| WO | WO 2014/045597 A1 | 3/2014 |

OTHER PUBLICATIONS

International Search Report issued Jan. 17, 2014 for PCT/JP2013/004804 filed on Aug. 8, 2013 in English.

Written Opinion issued Jan. 17, 2014 for PCT/JP2013/004804 filed on Aug. 8, 2013 in English.

Office Action issued Dec. 3, 2015 in Korean Patent Application No. 10-2015-7007112 (with English language translation).

Office Action issued Dec. 17, 2014 in Japanese Patent Application No. 2012-211420 (with English language translation).

Office Action issued Jan. 14, 2016 in European Patent Application No. 13 763 320.2.

* cited by examiner

_US 9,425,432 B2_

ORGANIC ELECTROLUMINESCENT ELEMENT AND LIGHT EMITTING DEVICE WITH OPTICAL PATH CONTROL LAYER

CROSS-REFERENCE TO RELATED APPLICATIONS

This application is based upon and claims the benefit of priority from Japanese Patent Application No. 2012-211420, filed on Sep. 25, 2012, and PCT Patent Application PCT/JP2013/004804, filed on Aug. 8, 2013; the entire contents of which are incorporated herein by reference.

FIELD

Embodiments described herein relate generally to an organic electroluminescent element and a light emitting device.

BACKGROUND

The organic electroluminescent element includes a cathode electrode, an anode electrode, and an organic light emitting layer provided between the cathode electrode and the anode electrode.

In the organic electroluminescent element, a voltage is applied between the cathode electrode and the anode electrode. Thus, electrons are injected from the cathode electrode into the organic light emitting layer, and holes are injected from the anode electrode into the organic light emitting layer. The injected electrons and holes are recombined, and excitons are generated by the recombination. When the exciton undergoes radiative deactivation, light is generated.

In such an organic electroluminescent element, improvement in light extraction efficiency is desired.

DETAILED DESCRIPTION

Figure 1A:
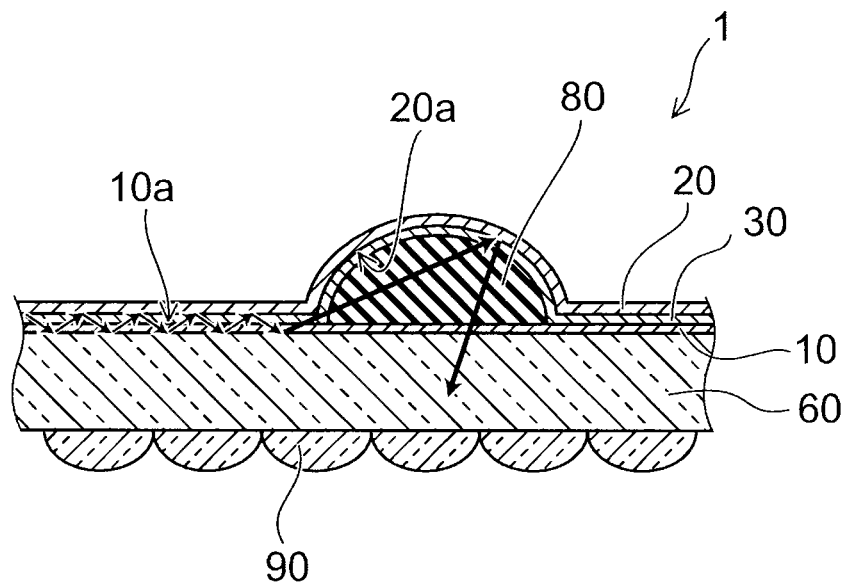
FIGS. 1A and 1B are schematic sectional views illustrating organic electroluminescent elements according to a first embodiment.

According to one embodiment, an organic electroluminescent element includes a first electrode, a second electrode provided opposite to the first electrode, an organic light emitting layer provided between the first electrode and the second electrode, and a protrusion. The protrusion is provided at least one of between the first electrode and the organic light emitting layer and between the organic light emitting layer and the second electrode.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

Figure 1B:
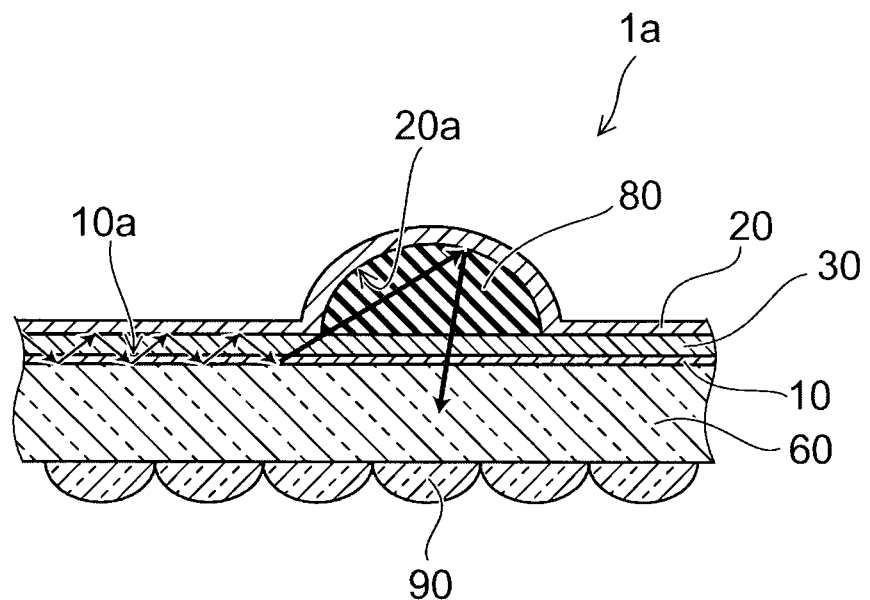

FIGS. 1A and 1B are schematic sectional views illustrating organic electroluminescent elements according to a first embodiment.

FIG. 1A shows the case where the protrusion 80 described later is provided between a first electrode 10 and an organic light emitting layer 30.

FIG. 1B shows the case where the protrusion 80 is provided between an organic light emitting layer 30 and a second electrode 20.

As shown in FIGS. 1A and 1B, the organic electroluminescent element 1, 1a includes the first electrode 10, the second electrode 20, an organic light emitting layer 30, and a protrusion 80.

The first electrode 10 is transmissive to light emitted from the organic light emitting layer 30.

The first electrode 10 functions as e.g. an anode. The thickness dimension of the first electrode 10 can be set to e.g. 50 nanometers (nm) or more.

The first electrode 10 includes e.g. an oxide containing at least one element selected from the group consisting of In, Sn, Zn, and Ti. The first electrode 10 can be made of e.g. a film (such as NESA) fabricated from a conductive glass containing such as indium oxide, zinc oxide, tin oxide, indium tin oxide (ITO) film, fluorine-doped tin oxide (FTO), and indium zinc oxide. The refractive index of the first electrode 10 is e.g. 1.7 or more and 2.2 or less.

The second electrode 20 is provided opposite to the first electrode 10.

The second electrode 20 is reflective to light emitted from the organic light emitting layer 30. The light reflectance of the second electrode 20 is higher than the light reflectance of the first electrode 10. In this specification, the state of having a light reflectance higher than the light reflectance of the first electrode 10 is referred to as being reflective.

The second electrode 20 functions as e.g. a cathode. The thickness dimension of the second electrode 20 can be set to e.g. 5 nanometers (nm) or more. In the case of 5 nanometers (nm) or more, part of the light emitted from the organic light emitting layer 30 can be reflected, and a current can be effectively supplied to the organic light emitting layer 30.

The second electrode 20 contains e.g. at least one of aluminum and silver. For instance, the second electrode 20 is made of an aluminum film. Alternatively, the second electrode may be made of an alloy of silver and magnesium. Furthermore, calcium may be added to this alloy.

The organic light emitting layer 30 is provided between the first electrode 10 and the second electrode 20. The organic light emitting layer 30 emits e.g. light containing a component of the wavelength of visible light. For instance, the light emitted from the organic light emitting layer 30 is substantially white light. That is, the light emitted out from the organic electroluminescent element 1, 1a is white light. Here, "white light" is substantially white, and includes light in such as red-tinged, yellow-tinged, green-tinged, blue-tinged, and violet-tinged white.

The thickness dimension of the organic light emitting layer 30 can be set to e.g. 5 nanometers (nm) or more.

The refractive index of the organic light emitting layer 30 is e.g. 1.7 or more and 2.2 or less.

The organic light emitting layer 30 can be made of a material such as $Alq_3$ (tris(8-hydroxyquinolinato)aluminum), F8BT (poly(9,9-dioctylfluorene)-co-benzothiadiazole), and PPV (poly(p-phenylene vinylene)).

Furthermore, the organic light emitting layer 30 can be made of e.g. a mixed material of a host material and a dopant added to the host material. The host material can be based on such as CBP (4,4'-N,N'-bis(carbazolyl)-1,1'-biphenyl), BCP (2,9-dimethyl-4,7-diphenyl-1,10-phenanthroline), TPD (tetraphenyldiaminobiphenyl), PVK (polyvinyl carbazole), and PPT (poly(3-phenylthiophene)). The dopant material can be based on such as Flrpic (iridium(III) bis(4,6-difluorophenyl)-pyridinato-N,C2'-picolinate), $Ir(ppy)_3$ (tris(2-phenylpyridine)iridium), and Flr6 (bis(2,4-difluorophenylpyridinato)-tetrakis(1-pyrazolyl)borate iridium(III)).

Furthermore, the organic electroluminescent element 1, is can further include a first functional layer and a second functional layer, not shown, as necessary.

The first functional layer, not shown, is provided between the organic light emitting layer 30 and the first electrode 10. The thickness dimension of the first functional layer can be set to e.g. 1 nanometer (nm) or more and 500 nanometers (nm) or less.

When the first functional layer is provided, the protrusion 80 is provided between the first electrode 10 and the first functional layer.

The first functional layer functions as e.g. a hole injection layer. The first functional layer functioning as a hole injection layer contains such as PEDPOT:PPS (poly(3,4-ethylenedioxythiophene)-poly(styrene sulfonate)), CuPc (copper phthalocyanine), and $MoO_3$ (molybdenum trioxide).

The first functional layer functions as e.g. a hole transport layer. The first functional layer functioning as a hole transport layer contains such as α-NPD (4,4'-bis[N-(1-naphthyl)-N-phenylamino]biphenyl), TAPC (1,1-bis[4-[N,N-di(p-tolyl)amino]phenyl]cyclohexane), m-MTDATA (4,4',4"-tris[phenyl(m-tolyl)amino]triphenylamine), TPD (bis(3-methylphenyl)-N,N'-diphenylbenzidine), and TCTA (4,4',4"-tri(N-carbazoyl)triphenylamine).

The first functional layer may be made by stacking a layer functioning as a hole injection layer and a layer functioning as a hole transport layer.

The second functional layer, not shown, is provided between the organic light emitting layer 30 and the second electrode 20. The thickness dimension of the second functional layer can be set to e.g. 1 nanometer (nm) or more and 500 nanometers (nm) or less.

The second functional layer functions as e.g. an electron transport layer. The second functional layer contains such as $Alq_3$ (tris(8-quinolinolato)aluminum(III)), BAlq (bis(2-methyl-8-quinolinolato-N1,O8)-(1,1'-biphenyl-4-olato)aluminum), Bphen (bathophenanthroline), and 3TPYMB (tris[3-(3-pyridyl)mesityl]borane).

The second functional layer functions as e.g. an electron injection layer. In this case, the second functional layer contains such as lithium fluoride, cesium fluoride, and lithium quinoline complex.

Alternatively, the second functional layer may be made by stacking a layer functioning as an electron transport layer and a layer functioning as an electron injection layer. In this case, the layer functioning as an electron injection layer is intended to improve the electron injection characteristics. The layer functioning as an electron injection layer is provided between the layer functioning as an electron transport layer and the second electrode 20.

The protrusion 80 is provided between the first electrode 10 and the second electrode 20.

As shown in FIG. 1A, in the organic electroluminescent element 1, the protrusion 80 is provided between the first electrode 10 and the organic light emitting layer 30.

As shown in FIG. 1B, in the organic electroluminescent element 1a, the protrusion 80 is provided between the organic light emitting layer 30 and the second electrode 20.

If the protrusion 80 is provided between the first electrode 10 and the second electrode 20, the light extraction efficiency can be improved. In this case, the light extraction efficiency can be improved whether by providing the protrusion 80 between the first electrode 10 and the organic light emitting layer 30 or by providing the protrusion 80 between the organic light emitting layer 30 and the second electrode 20.

Details on the improvement in the light extraction efficiency will be described later.

Here, in the case where the protrusion 80 is provided between the organic light emitting layer 30 and the second electrode 20, the protrusion 80 is formed on the organic light emitting layer 30. For instance, the protrusion 80 having a width dimension of 1 micrometer (μm) or more and 20 micrometers (μm) or less can be formed by photolithography technique and the like. For instance, the protrusion 80 having a width dimension of 20 micrometers (μm) or more and 1000 micrometers (μm) or less can be formed by vacuum evaporation technique or sputtering technique using a metal mask. In the case where the protrusion 80 is formed on the organic light emitting layer 30, the organic light emitting layer 30 can be formed on a flat first electrode 10. Thus, the organic light emitting layer 30 is made flat. This facilitates the formation of the protrusion 80. However, use of photolithography technique or sputtering technique may damage the organic light emitting layer 30. This may require countermeasures such as providing a protective layer before forming the protrusion 80.

In contrast, in the case where the protrusion 80 is provided between the first electrode 10 and the organic light emitting layer 30, the protrusion 80 is formed on the first electrode 10, and the organic light emitting layer 30 is formed so as to cover the first electrode 10 and the protrusion 80. For instance, the protrusion 80 having a width dimension of 1 micrometer (μm) or more and 20 micrometers (μm) or less can be formed by photolithography technique and the like. For instance, the protrusion 80 having a width dimension of 20 micrometers (μm) or more and 1000 micrometers (μm) or less can be formed by vacuum evaporation technique or sputtering technique using a metal mask. In this case, the protrusion 80 can be formed before forming the organic light emitting layer 30. Thus, there occurs no damage to the organic light emitting layer 30.

The protrusion 80 can be provided in a plurality and spaced from each other.

The protrusion 80 is transmissive to light emitted from the organic light emitting layer 30.

Furthermore, the protrusion 80 is conductive or insulative.

The protrusion 80 can be formed from a conductive material being sufficiently conductive and having higher conductivity by one or more orders of magnitude (in units of S/m) than the organic light emitting layer 30. Then, the protrusion 80 functions as part of the first electrode 10 or the second electrode 20. In this case, light emission occurs also in the organic light emitting layer 30 overlapping the portion in which the protrusion 80 is formed. Thus, there is no decrease in the light emitting area due to the provision of the protrusion 80. Furthermore, in the case where the protrusion 80 being conductive is provided between the organic light emitting layer 30 and the second electrode 20, the organic light emitting layer 30 is formed on a flat first electrode 10. Thus, there occurs no problem such as short circuit.

On the other hand, if the protrusion 80 is insulative, then although the light emitting area decreases, there occurs no problem such as short circuit in either case where the protrusion 80 is provided between the first electrode 10 and the organic light emitting layer 30 or between the organic light emitting layer 30 and the second electrode 20. This facilitates the fabrication of the organic electroluminescent element.

The refractive index of the protrusion 80 can be made comparable to the refractive index of the organic light emitting layer 30. If the refractive index of the protrusion 80 is comparable to the refractive index of the organic light emitting layer 30, light can be smoothly introduced into the protrusion 80 from the organic light emitting layer 30 side.

For instance, the refractive index of the protrusion 80 is denoted by n, and the refractive index of the organic light emitting layer 30 is denoted by $n_1$. Then, the refractive indices can be set as $n_1 \times 0.9 \le n \le n_1 \times 1.1$.

The protrusion 80 can be made of e.g. $SiN_x$. The "x" means integer.

Alternatively, the protrusion 80 can be made of e.g. a polymer resin such as an acrylic resin (e.g., refractive index=1.49) and a triazine-based resin (e.g., refractive index=1.7 to 1.8).

In the case of using a polymer resin, the refractive index can be adjusted by dispersing a plurality of particles having higher refractive index than the polymer resin inside the polymer resin. A particle having higher refractive index than the polymer resin is a particle made of such as a titanium oxide (e.g., refractive index=2.7) and a zirconium oxide.

For instance, in the case of using an acrylic resin having a refractive index of 1.49, particles made of titanium oxide having a refractive index of 2.7 can be used. Then, the proportion of the particles to the acrylic resin can be set to approximately 20%. Then, the refractive index of the protrusion 80 can be set to approximately 1.7. Alternatively, the proportion of the particles to the acrylic resin can be set to approximately 60%. Then, the refractive index of the protrusion 80 can be set to approximately 2.2.

Thus, by changing the proportion of the particles to the polymer resin, the refractive index of the protrusion 80 can be made comparable to the refractive index of the organic light emitting layer 30.

The protrusion 80 is projected from the first electrode 10 or the organic light emitting layer 30 toward the second electrode 20 side. The protrusion 80 is shaped so that the cross-sectional area in the direction parallel to the surface 10a of the first electrode 10 gradually decreases toward the second electrode 20 side. That is, the plurality of protrusions 80 are shaped so that the cross-sectional area in the direction parallel to the extending direction of the first electrode 10 gradually decreases toward the second electrode 20 side.

The protrusion 80 can be shaped like e.g. a hemisphere as shown in FIGS. 1A and 1B.

However, the shape of the protrusion 80 is not limited to a hemisphere.

Figure 2:
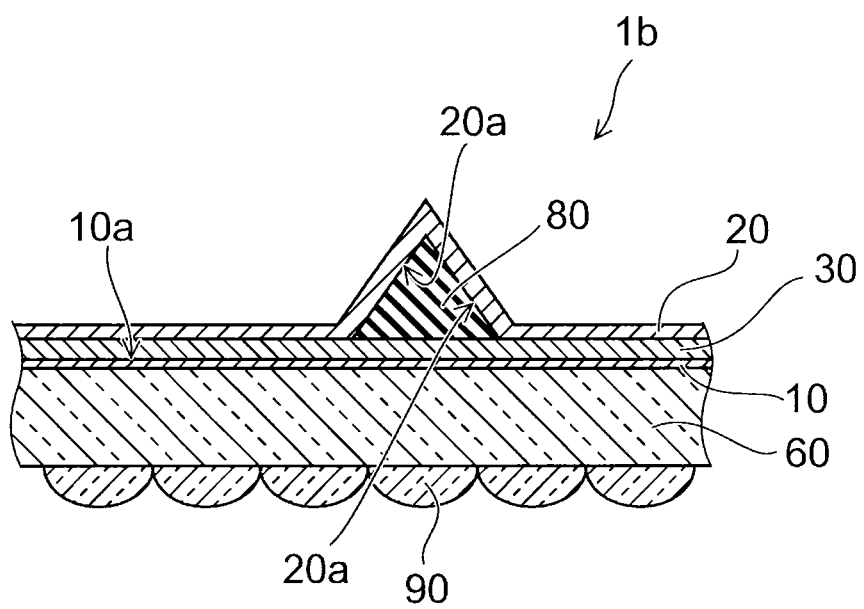
FIG. 2 is a schematic sectional view for illustrating an alternative shape of a protrusion 80.

FIG. 2 is a schematic sectional view for illustrating an alternative shape of the protrusion 80.

As in the organic electroluminescent element 1b shown in FIG. 2, the protrusion 80 can also be shaped like a quadrangular prism.

Furthermore, the protrusion 80 can be configured to have an arbitrary shape such as a cone, prism, truncated cone, truncated prism, hemisphere, and semi ellipsoid.

The protrusion 80 is shaped so that the cross-sectional area in the direction parallel to the surface 10a of the first electrode 10 gradually decreases toward the second electrode 20 side. Thus, a reflective surface 20a can be formed in the second electrode 20.

Light propagated with reflection inside the first electrode 10 and the organic light emitting layer 30 is introduced into the protrusion 80 and is incident on the reflective surface 20a. The reflective surface 20a is inclined with respect to the surface 10a of the first electrode 10. Thus, the light incident on the reflective surface 20a is reflected toward the substrate 60 side. Accordingly, the light confined inside the first electrode 10 and the organic light emitting layer 30 can be extracted to the outside. Thus, the light extraction efficiency can be improved.

The arrangement configuration of the protrusions 80 is not particularly limited. For instance, a plurality of protrusions 80 can be regularly arranged like a matrix and the like, or can be arranged in an arbitrary configuration.

The plurality of protrusions 80 may be equally sized, or may include protrusions 80 with different sizes.

The organic electroluminescent element 1, is illustrated in FIGS. 1A and 1B includes a substrate 60 on the opposite side of the first electrode 10 from the side provided with the organic light emitting layer 30. That is, the first electrode 10 is provided between the substrate 60 and the organic light emitting layer 30. The substrate 60 is transmissive to light emitted from the organic light emitting layer 30. The substrate 60 can be made of e.g. transmissive glass such as quartz glass, alkali glass, and alkali-free glass. Alternatively, the substrate 60 can also be made of e.g. transmissive resin such as polyethylene terephthalate, polycarbonate, polymethyl methacrylate, polypropylene, polyethylene, amorphous polyolefin, and fluorine-based resin. The refractive index of the substrate 60 is e.g. 1.4 or more and 1.7 or less.

Furthermore, the organic electroluminescent element 1, 1a includes a plurality of microlenses 90 on the surface of the substrate 60 on the opposite side from the side provided with the first electrode 10. For instance, the microlens 90 can be shaped like a hemisphere. The height dimension (the length along the thickness direction of the substrate 60) of the microlens 90 can be set to e.g. 1 micrometer (μm) or more and 50 micrometers (μm) or less. In this case, the diameter dimension of the microlens 90 is 2 micrometers (μm) or more and 100 micrometers (μm) or less. However, the shape and dimension of the microlens 90 are not limited to those illustrated, but can be appropriately changed.

The plurality of microlenses 90 can be formed by photolithography technique and the like. However, use of photolithography technique involves what is called the thin film process in which the film thickness of the film to be processed is 10 micrometers (μm) or less. In this case, if the diameter of the microlens 90 is larger than 2 micrometers (μm), the height dimension of the microlenses 90 needs to be set to approximately 1 micrometer (μm) in order to achieve an ideal lens shape of the microlens 90. Then, cracks may occur due to the internal stress of the thin film. This makes it difficult to process the microlens 90. Thus, if photolithography technique and the like are used, microlenses 90 having an appropriate shape are difficult to form stably.

In contrast, if a microlens sheet with a plurality of microlenses 90 arranged like a matrix is affixed, microlenses 90 having an appropriate shape can be easily provided.

In the illustrated example, a plurality of microlenses 90 are provided. However, an arbitrary optical element capable of changing the traveling direction of light may be provided. For instance, other optical elements can be provided by using another optical film such as a lenticular lens sheet and a sheet having a pyramid structure.

Figure 3:
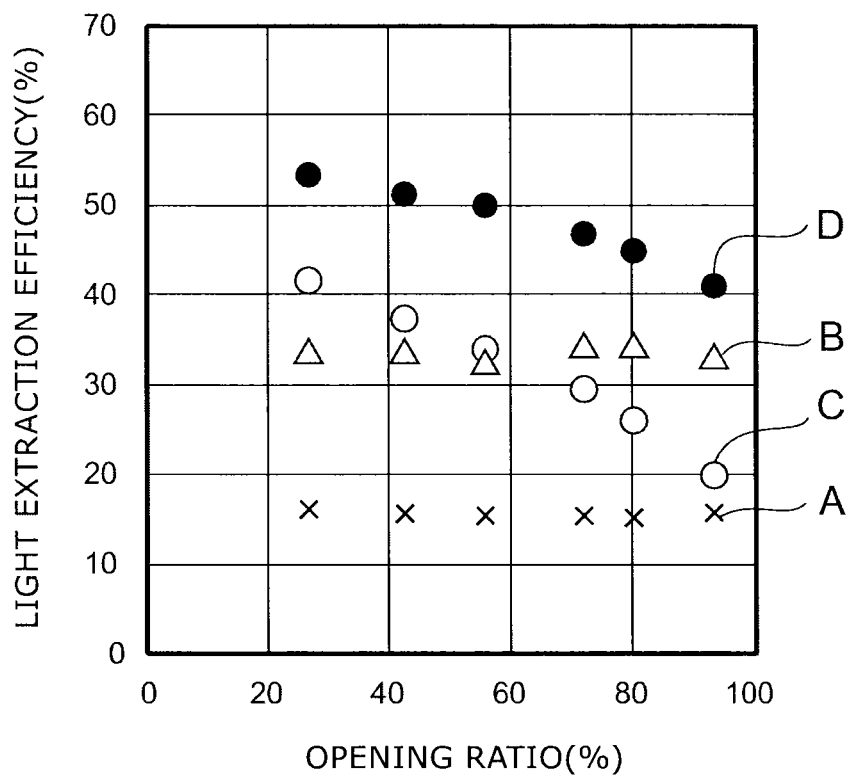
FIG. 3 is a graph illustrating the light extraction efficiency in the case of providing a protrusion 80 shaped like a hemisphere.

FIG. 3 is a graph illustrating the light extraction efficiency in the case of providing a protrusion 80 shaped like a hemisphere.

The horizontal axis of FIG. 3 represents the opening ratio. That is, it represents the ratio of the area of the region not provided with the protrusion 80 to the area of the surface of the first electrode 10 or to the area of the surface of the organic light emitting layer 30.

The vertical axis of FIG. 3 represents the light extraction efficiency.

FIG. 3 shows an example of ray-trace simulation results for the light extraction efficiency.

The condition of the simulation was set as follows.

For the first electrode 10, the refractive index was set to 1.8, and the thickness dimension was set to 100 nanometers (nm). For the organic light emitting layer 30, the refractive index was set to 1.8, and the thickness dimension was set to 100 nanometers (nm). The protrusion 80 was shaped like a hemisphere having a refractive index of 1.8 and a diameter dimension of 3 micrometers (μm). The microlens 90 was shaped like a hemisphere having a refractive index of 1.5 and a diameter dimension of 30 micrometers (μm). The wavelength of light generated in the organic light emitting layer 30 was set to 525 nanometers (nm).

Then, the opening ratio was changed, and the light extraction efficiency for each case was calculated.

In FIG. 3, "A" represents the case where the protrusion 80 and the microlens 90 are not provided. "B" represents the case where the protrusion 80 is not provided but the microlens 90 is provided. "C" represents the case where the protrusion 80 is provided but the microlens 90 is not provided. "D" represents the case where the protrusion 80 and the microlens 90 are provided.

As seen from "A" and "C", the light extraction efficiency can be improved by providing the protrusion 80. Furthermore, as seen from "C" and "D", as the opening ratio is made smaller, i.e., as the number of protrusions 80 is made larger, the light extraction efficiency can be made higher. Furthermore, as seen from "D", the light extraction efficiency can be further improved by providing the protrusion 80 and the microlens 90.

Figure 4:
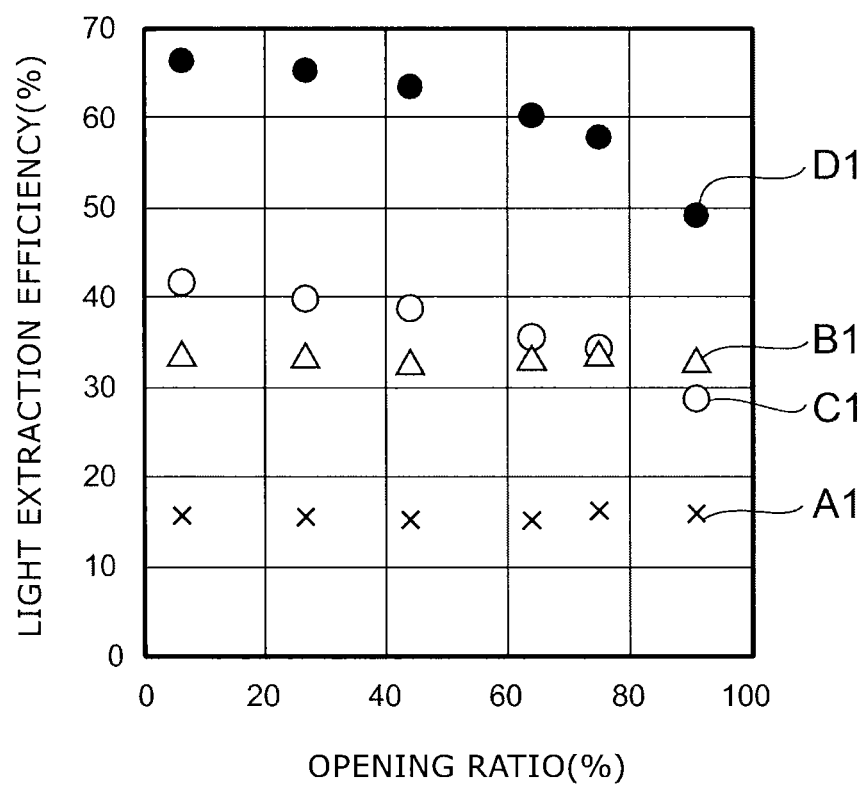
FIG. 4 is a graph illustrating the light extraction efficiency in the case of providing a protrusion 80 shaped like a quadrangular prism.

FIG. 4 is a graph illustrating the light extraction efficiency in the case of providing a protrusion 80 shaped like a quadrangular prism.

The horizontal axis of FIG. 4 represents the opening ratio. That is, it represents the ratio of the area of the region not provided with the protrusion 80 to the area of the surface of the first electrode 10 or to the area of the surface of the organic light emitting layer 30.

The vertical axis of FIG. 4 represents the light extraction efficiency.

FIG. 4 shows an example of ray-trace simulation results for the light extraction efficiency.

The condition of the simulation was set as follows.

For the first electrode 10, the refractive index was set to 1.8, and the thickness dimension was set to 100 nanometers (nm). For the organic light emitting layer 30, the refractive index was set to 1.8, and the thickness dimension was set to 100 nanometers (nm). The protrusion 80 was shaped like a quadrangular prism having a refractive index of 1.8 in which the length of one side of the square base is 3 micrometers (μm) and the height dimension is 3 micrometers (μm). The microlens 90 was shaped like a hemisphere having a refractive index of 1.5 and a diameter dimension of 30 micrometers (μm). The wavelength of light generated in the organic light emitting layer 30 was set to 525 nanometers (nm).

Then, the opening ratio was changed, and the light extraction efficiency for each case was calculated.

In FIG. 4, "A1" represents the case where the protrusion 80 and the microlens 90 are not provided. "B1" represents the case where the protrusion 80 is not provided but the microlens 90 is provided. "C1" represents the case where the protrusion 80 is provided but the microlens 90 is not provided. "D1" represents the case where the protrusion 80 and the microlens 90 are provided.

As seen from "A1" and "C1", the light extraction efficiency can be improved by providing the protrusion 80. Furthermore, as seen from "C1" and "D1", as the opening ratio is made smaller, i.e., as the number of protrusions 80 is made larger, the light extraction efficiency can be made higher. Furthermore, as seen from "D1", the light extraction efficiency can be further improved by providing the protrusion 80 and the microlens 90.

Furthermore, as seen from "C" and "D" in FIG. 3 and "C1" and "D1" in FIG. 4, the light extraction efficiency is changed with the shape of the protrusion 80.

That is, if the protrusion 80 is shaped so as to form a flat reflective surface 20a in the second electrode 20, the light extraction efficiency can be further improved.

For instance, the protrusion 80 is preferably shaped like such as a prism and truncated prism.

Figure 5:
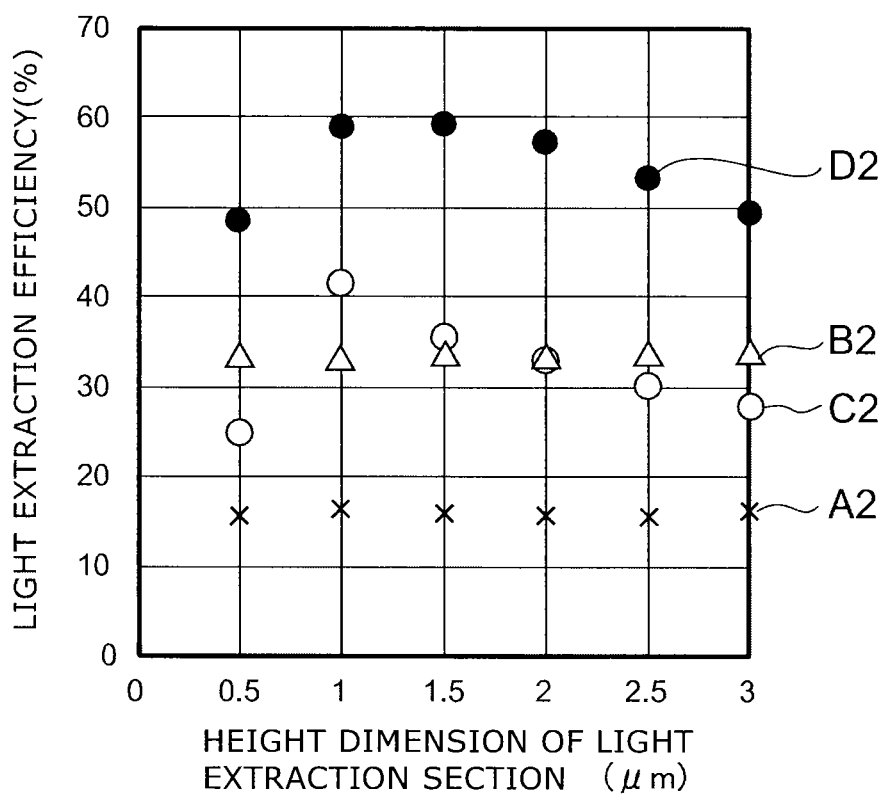
FIG. 5 is a graph illustrating the light extraction efficiency in the case of providing a protrusion 80 shaped like a quadrangular prism.

FIG. 5 is a graph illustrating the light extraction efficiency in the case of providing a protrusion 80 shaped like a quadrangular prism.

The horizontal axis of FIG. 5 represents the height dimension of the protrusion 80.

The vertical axis of FIG. 5 represents the light extraction efficiency.

FIG. 5 shows an example of ray-trace simulation results for the light extraction efficiency.

The condition of the simulation was set as follows.

For the first electrode 10, the refractive index was set to 1.8, and the thickness dimension was set to 100 nanometers (nm). For the organic light emitting layer 30, the refractive index was set to 1.8, and the thickness dimension was set to 100 nanometers (nm). The protrusion 80 was shaped like a quadrangular prism having a refractive index of 1.8 in which the length of one side of the square base is 3 micrometers (μm). The microlens 90 was shaped like a hemisphere having a refractive index of 1.5 and a diameter dimension of 30 micrometers (μm). The wavelength of light generated in the organic light emitting layer 30 was set to 525 nanometers (nm).

Then, the height dimension of the protrusion 80 was changed, and the light extraction efficiency for each case was calculated.

In FIG. 5, "A2" represents the case where the protrusion 80 and the microlens 90 are not provided. "B2" represents the case where the protrusion 80 is not provided but the microlens 90 is provided. "C2" represents the case where the protrusion 80 is provided but the microlens 90 is not provided. "D2" represents the case where the protrusion 80 and the microlens 90 are provided.

As seen from "A2" and "C2", the light extraction efficiency can be improved by providing the protrusion 80. Furthermore, as seen from "D2", the light extraction efficiency can be further improved by providing the protrusion 80 and the microlens 90. Furthermore, as seen from "C2" and "D2", if the height dimension of the protrusion 80 is set to 1 micrometer (μm) or more and 3 micrometers (μm) or less, the light extraction efficiency can be further improved.

The length of one side of the base of the protrusion 80 is 3 micrometers (μm). Thus, if the ratio of the length of one side of the base to the height is set to 3:1 to 1:1, the light extraction efficiency can be further improved. For instance, in the case where the length of one side of the base of the protrusion 80 is 30 micrometers (μm), if the height is set to 10 micrometers (μm) or more and 30 micrometers (μm) or less, the light extraction efficiency can be further improved.

In the present case, the base of the protrusion 80 is a square with the length L of one side being 3 micrometers (μm). Thus, the maximum length $L_{MAX}$ at the base is the length of the diagonal, which is 4.2 micrometers (μm).

The maximum length at the base of the protrusion 80 is denoted by $L_{MAX}$, and the height of the protrusion 80 is denoted by H. Then, the light extraction efficiency can be further improved by setting $1.4 \leq L_{MAX}/H \leq 4.2$. The unit of $L_{MAX}$ is micrometers (μm). The unit of H is micrometers (μm).

This is the case where the base is a square. However, a similar effect is achieved in the case where the base is shaped differently.

That is, the maximum length at the surface (base) of the protrusion 80 on the first electrode 10 side is denoted by $L_{MAX}$, and the height of the protrusion 80 is denoted by H. Then, the light extraction efficiency can be further improved by setting $1.4 \leq L_{MAX}/H \leq 4.2$.

Here, the maximum length $L_{MAX}$ at the surface (base) of the protrusion 80 on the first electrode 10 side is the maximum length of a line segment formed at the surface (base) of the protrusion 80 on the first electrode 10 side.

For instance, in the case where the surface (base) of the protrusion 80 on the first electrode 10 side is circular, the maximum length $L_{MAX}$ is the length of the diameter. In the case where the surface (base) of the protrusion 80 on the first electrode 10 side is quadrangular, the maximum length $L_{MAX}$ is the length of the diagonal. In the case where the surface (base) of the protrusion 80 on the first electrode 10 side is elliptic, the maximum length $L_{MAX}$ is the length of the long axis.

Here, the maximum length $L_{MAX}$ at the surface (base) of the protrusion 80 on the first electrode 10 side does not need to be a length inside the surface (base) of the protrusion 80 on the first electrode 10 side.

For instance, in the case where the surface (base) of the protrusion 80 on the first electrode 10 side is triangular, the maximum length $L_{MAX}$ is the length of one side of the triangle.

Second Embodiment

Figure 6A:
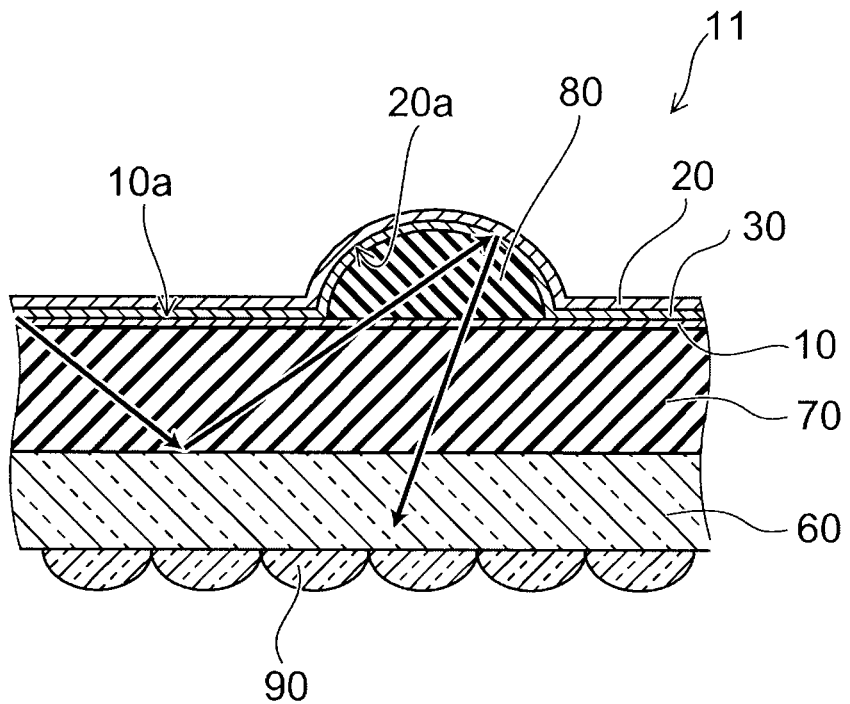
FIGS. 6A and 6B are schematic sectional views illustrating organic electroluminescent elements according to a second embodiment.
Figure 6B:
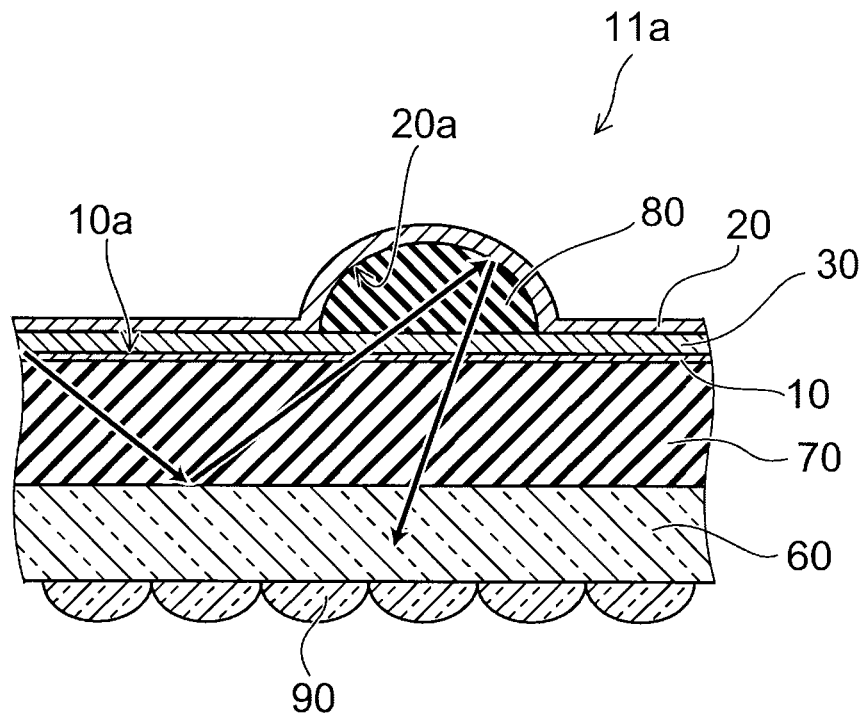

FIGS. 6A and 6B are schematic sectional views illustrating organic electroluminescent elements according to a second embodiment.

FIG. 6A shows the case where the protrusion 80 is provided between the first electrode 10 and the organic light emitting layer 30.

FIG. 6B shows the case where the protrusion 80 is provided between the organic light emitting layer 30 and the second electrode 20.

As shown in FIGS. 6A and 6B, the organic electroluminescent element 11, 11a includes the first electrode 10, the second electrode 20, an organic light emitting layer 30, a protrusion 80, and an optical path control layer 70. Furthermore, like the aforementioned organic electroluminescent element 1, 1a, the organic electroluminescent element 11, 11a may further include a substrate 60 and a microlens 90.

In the illustrated example, the protrusion 80 shaped like a hemisphere is provided. However, the shape of the protrusion 80 is not limited to a hemisphere.

The protrusion 80 can be configured to have an arbitrary shape such as a cone, prism, truncated cone, truncated prism, hemisphere, and semi ellipsoid.

The organic electroluminescent element 11, 11a is different from the aforementioned organic electroluminescent element 1, 1a in that the optical path control layer 70 is further provided.

The optical path control layer 70 is provided on the opposite side of the first electrode 10 from the side provided with the organic light emitting layer 30. In the example illustrated in FIGS. 6A and 6B, the optical path control layer 70 is provided between the first electrode 10 and the substrate 60.

The optical path control layer 70 is transmissive to light emitted from the organic light emitting layer 30.

The material of the optical path control layer 70 is not particularly limited as long as it is transmissive to light emitted from the organic light emitting layer 30. However, the refractive index of the optical path control layer 70 can be made comparable to the refractive index of the organic light emitting layer 30. If the refractive index of the optical path control layer 70 is comparable to the refractive index of the organic light emitting layer 30, light can be smoothly introduced between the organic light emitting layer 30 side and the optical path control layer 70.

For instance, the refractive index of the optical path control layer 70 is denoted by $n_2$, and the refractive index of the organic light emitting layer 30 is denoted by $n_1$. Then, the refractive indices can be set as $n_1 \times 0.9 \leq n_2 \leq n_1 \times 1.1$.

As described above, the refractive index of the protrusion 80 can be made comparable to the refractive index of the organic light emitting layer 30. Thus, the refractive index of the optical path control layer 70, the refractive index of the organic light emitting layer 30, and the refractive index of the protrusion 80 can be made comparable.

In this case, the material of the optical path control layer 70 can be made identical to the material of the protrusion 80. The thickness dimension of the optical path control layer 70 can be set to e.g. 1 micrometer (μm) or more and 100 micrometers (μm) or less.

Next, the function of the optical path control layer 70 is further described.

The organic electroluminescent element 1, 1a illustrated in FIGS. 1A and 1B does not include the optical path control layer 70.

Thus, as shown in FIGS. 1A and 1B, light propagates while being reflected between the substrate 60 and the second electrode 20. In this case, the distance between the substrate 60 and the second electrode 20 is short. Thus, the number of times of reflection relative to the propagation distance of light is large. As the number of times of reflection becomes larger, loss due to reflection becomes higher.

For instance, if the reflectance of the second electrode 20 is 90%, light can be reflected only approximately 10 times. Thus, the lateral propagation distance of light is approximately 1 to 3 µm. In this case, unless the width dimension and the pitch dimension of the protrusions 80 are made comparable to the lateral propagation distance of light, the propagating light of the emitted light does not enter the protrusion 80. For instance, in the case where the optical path control layer 70 is not provided as in the organic electroluminescent element 1, 1a according to the first embodiment, if the width dimension and the pitch dimension of the protrusions 80 are approximately 1 to 3 micrometers (µm), the width dimension and the pitch dimension of the protrusions 80 are comparable to the lateral propagation distance of light. Thus, the light extraction efficiency can be improved. In this case, the protrusion 80 can be formed by a semiconductor manufacturing process such as photolithography technique.

As shown in FIGS. 6A and 6B, also in the case where the optical path control layer 70 is provided, light propagates while being reflected between the substrate 60 and the second electrode 20. However, in the case where the optical path control layer 70 is provided, the distance between the substrate 60 and the second electrode 20 is made longer by the amount of the thickness dimension of the optical path control layer 70. This can decrease the number of times of reflection relative to the propagation distance of light.

As described above, if the reflectance of the second electrode 20 is 90%, light is reflected approximately 10 times. Thus, the lateral propagation distance of light can be made as long as approximately 10 times the film thickness of the optical path control layer 70. If the lateral propagation distance of light is made longer, the light extraction efficiency can be improved even if the width dimension and the pitch dimension of the protrusions 80 are set to approximately 10 times the film thickness of the optical path control layer 70. If the width dimension and the pitch dimension of the protrusions 80 can be made longer, the protrusions 80 can be formed by a cost-effective process such as screen printing technique.

Figure 7:
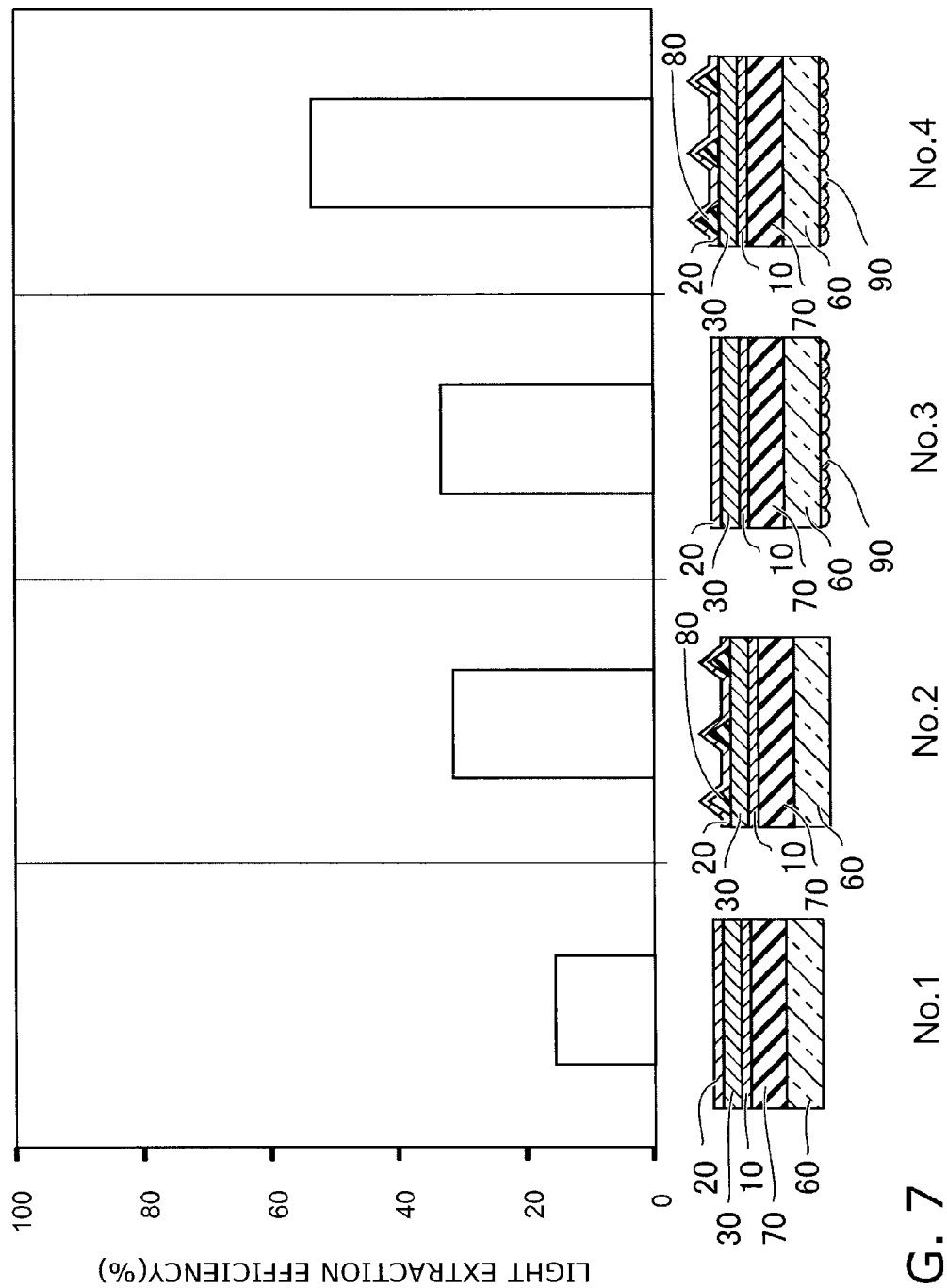
FIG. 7 is a graph for illustrating the light extraction efficiency.

FIG. 7 is a graph for illustrating the light extraction efficiency.

FIG. 7 shows an example simulation result for the light extraction efficiency in the configurations shown in No. 1 to No. 4.

The vertical axis of FIG. 7 represents the light extraction efficiency.

The configuration shown in No. 1 corresponds to the case where the protrusion 80 is not provided.

The configuration shown in No. 2 corresponds to the case where the protrusion 80 shaped like a quadrangular prism is provided and the microlens 90 is not provided.

The configuration shown in No. 3 corresponds to the case where a plurality of microlenses 90 are further provided in the configuration shown in No. 1.

The configuration shown in No. 4 corresponds to the case where a plurality of the microlenses 90 are further provided in the configuration shown in No. 2.

The condition of the simulation was set as follows.

For the first electrode 10, the refractive index was set to 1.8, and the thickness dimension was set to 100 nanometers (nm). For the organic light emitting layer 30, the refractive index was set to 1.8, and the thickness dimension was set to 100 nanometers (nm). The protrusion 80 was shaped like a quadrangular prism having a refractive index of 1.8 in which the length of one side of the square base is 80 micrometers (µm) and the height dimension is 60 micrometers (µm). A plurality of protrusions 80 were arranged like a matrix (lattice). The dimension between the protrusions 80 was set to 80 micrometers (µm). For the optical path control layer 70, the refractive index was set to 1.8, and the thickness dimension was set to 100 micrometers (µm). For the substrate 60, the refractive index was set to 1.5, and the thickness dimension was set to 700 micrometers (µm). The microlens 90 was shaped like a hemisphere having a refractive index of 1.5 and a diameter dimension of 30 micrometers (µm). The microlenses 90 were arranged in hexagonal closest packing, with the packing ratio being 82%. The wavelength of light generated in the organic light emitting layer 30 was set to 525 nanometers (nm).

As shown in No. 2 in FIG. 7, if the protrusion 80 is provided, the light extraction efficiency can be improved as compared with that shown in No. 1 in which the protrusion 80 is not provided. Furthermore, the light extraction efficiency can be improved also by setting the width dimension of the protrusion 80 to 80 micrometers (µm). Thus, an organic electroluminescent element having high light emission efficiency can be obtained cost-effectively using a method such as screen printing technique.

Furthermore, as shown in No. 4 in FIG. 7, if a plurality of microlenses 90 are further provided, the light extraction efficiency can be further improved.

Figure 8:
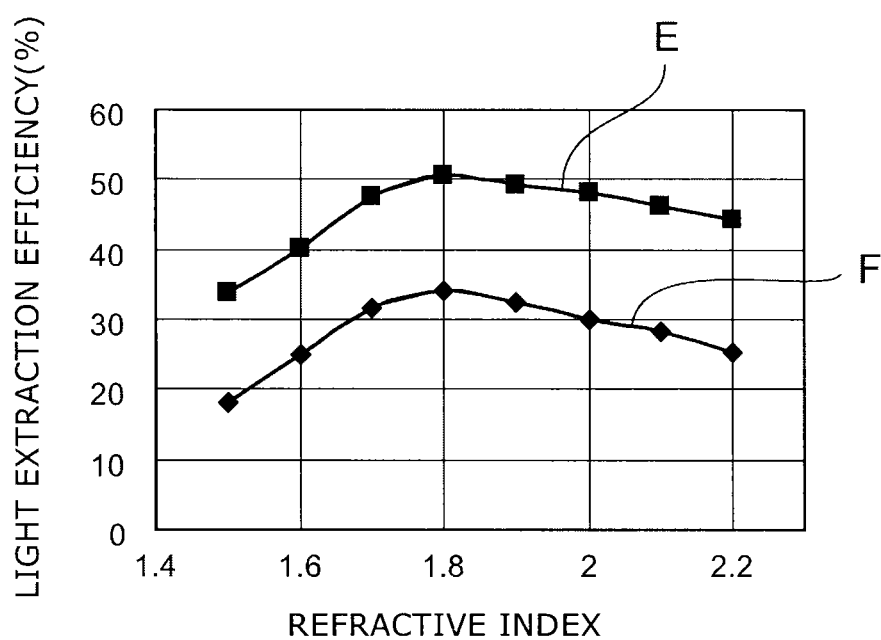
FIG. 8 is a graph for illustrating the relationship between the refractive index of the protrusion 80 and the light extraction efficiency.

FIG. 8 is a graph for illustrating the relationship between the refractive index of the protrusion 80 and the light extraction efficiency. In FIG. 8, "E" represents the case of including the microlens 90, and "F" represents the case of not including the microlens 90.

The condition of the simulation was set similarly to the case of FIG. 7. The refractive index of the organic light emitting layer 30 was fixed to 1.8.

The microlens 90 was shaped like a hemisphere having a diameter dimension of 3 micrometers (µm).

Here, as described above, the refractive index of the protrusion 80 is denoted by n, and the refractive index of the organic light emitting layer 30 is denoted by $n_1$. Then, the refractive indices can be set as $n_1 \times 0.9 \leq n \leq n_1 \times 1.1$.

That is, the refractive index n of the protrusion 80 can be set as $1.62 \leq n \leq 1.98$.

If the refractive index n of the protrusion 80 is set as described above, the light extraction efficiency can be improved as shown in "E" and "F" in FIG. 8.

Third Embodiment

Figure 9A:
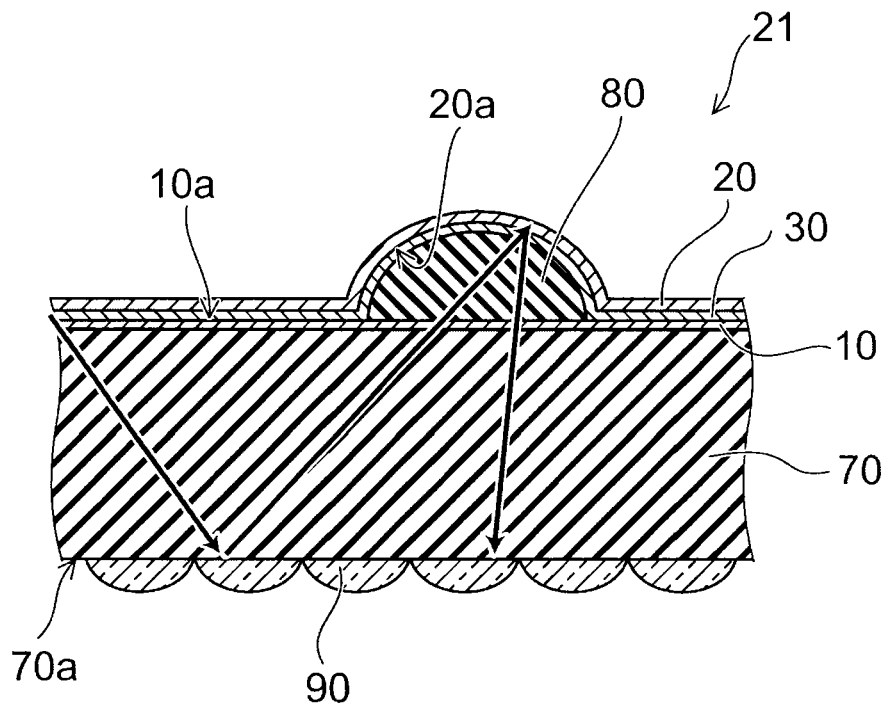
FIGS. 9A and 9B are schematic sectional views illustrating organic electroluminescent elements according to a third embodiment.
Figure 9B:
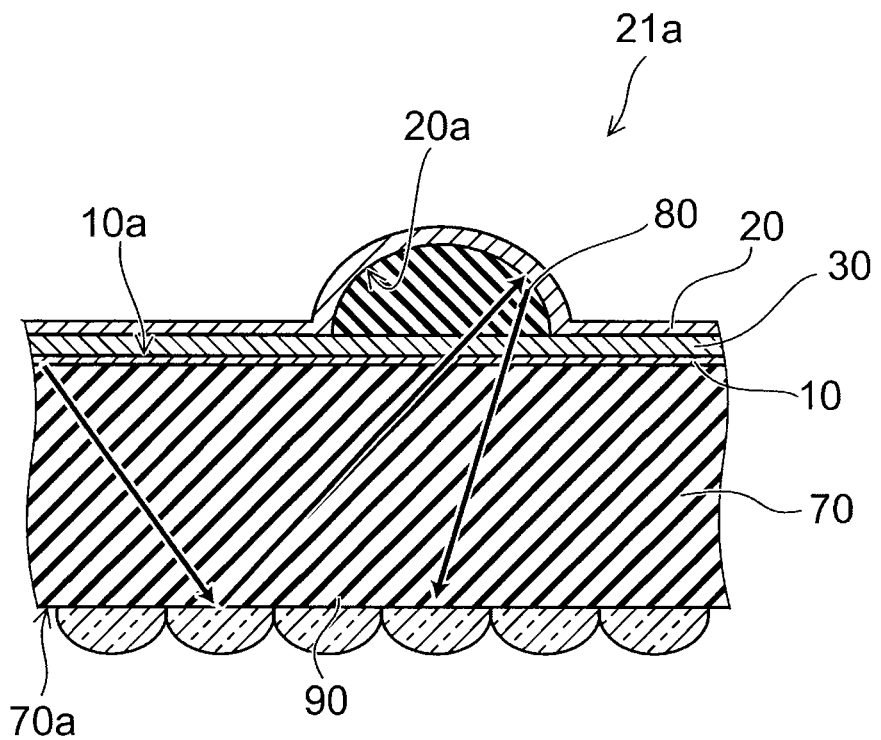

FIGS. 9A and 9B are schematic sectional views illustrating organic electroluminescent elements according to a third embodiment.

FIG. 9A shows the case where the protrusion 80 is provided between the first electrode 10 and the organic light emitting layer 30.

FIG. 9B shows the case where the protrusion 80 is provided between the organic light emitting layer 30 and the second electrode 20.

As shown in FIGS. 9A and 9B, the organic electroluminescent element 21, 21a includes a first electrode 10, a second electrode 20, an organic light emitting layer 30, a protrusion 80, and an optical path control layer 70. Furthermore, like the aforementioned organic electroluminescent element 1, 1a, the organic electroluminescent element 21, 21a may further include a microlens 90.

In the illustrated example, the protrusion 80 shaped like a hemisphere is provided. However, the shape of the protrusion 80 is not limited to a hemisphere.

The protrusion 80 can be configured to have an arbitrary shape such as a cone, prism, truncated cone, truncated prism, hemisphere, and semi ellipsoid.

The organic electroluminescent element 21, 21a is different from the aforementioned organic electroluminescent element 11, 11a in that the substrate 60 is omitted.

Alternatively, the refractive index of the substrate 60 is made comparable to the refractive index of the optical path control layer 70.

In the case of the organic electroluminescent element 21, 21a, light propagates while being reflected between the interface 70a of the optical path control layer 70 on the side provided with the microlens 90, and the second electrode 20. In this case, the distance between the interface 70a and the second electrode 20 can be made longer. This can decrease the number of times of reflection relative to the propagation distance of light. As described above, if the reflectance of the second electrode 20 is 90%, light is reflected approximately 10 times. Thus, the lateral propagation distance of light is made as long as approximately 10 times the film thickness of the optical path control layer 70. If the lateral propagation distance of light is made longer, the light extraction efficiency can be improved even if the width dimension and the pitch dimension of the protrusions 80 are set to approximately 10 times the film thickness of the optical path control layer 70. In this case, the protrusions 80 can be formed by a cost-effective process such as screen printing technique.

The organic electroluminescent elements described in the above first to third embodiments can be used in a light emitting device. The light emitting device including the organic electroluminescent element described in the first to the third embodiments has higher brightness for the same input electrical power, or lower input electrical power for the same brightness. As described below, besides the light emitting unit including the organic electroluminescent element, the light emitting device may include a driving unit and a control unit.

Figure 10:
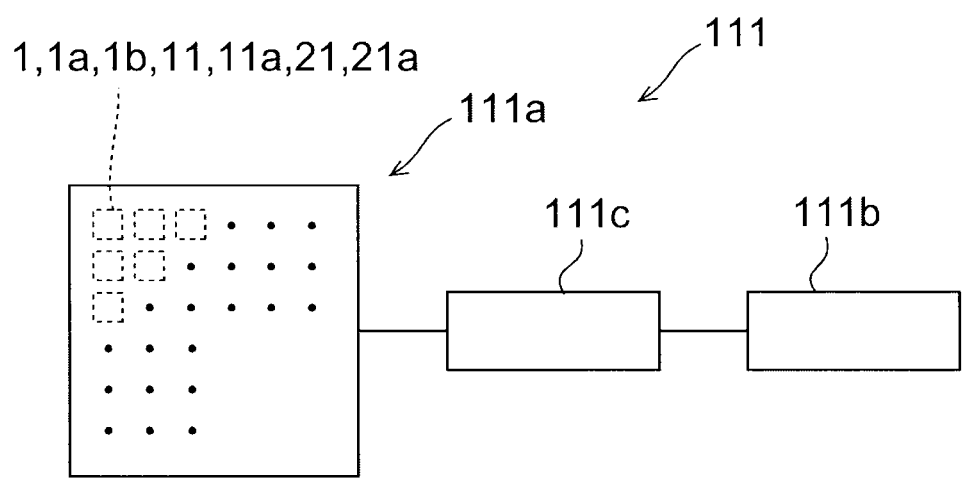
FIG. 10 is a schematic view for illustrating a light emitting device 111.

FIG. 10 is a schematic view for illustrating a light emitting device 111.

As shown in FIG. 10, the light emitting device 111 includes a light emitting unit 111a, a driving unit 111b, and a control unit 111c.

The light emitting unit 111a includes a plurality of the aforementioned organic electroluminescent elements 1, 1a, 1b, 11, 11a, 21, 21a. The arrangement configuration of the organic electroluminescent elements 1, 1a, 1b, 11, 11a, 21, 21a is not particularly limited. For instance, as illustrated in FIG. 10, it is possible to use a regular arrangement. Alternatively, it is also possible to use a non-regular arbitrary arrangement. Furthermore, the number of organic electroluminescent elements 1, 1a, 1b, 11, 11a, 21, 21a is not limited to that illustrated, but can be appropriately changed. The number of organic electroluminescent elements 1, 1a, 1b, 11, 11a, 21, 21a may be one.

The driving unit 111b can be configured to include e.g. a driving circuit for applying a current to each organic electroluminescent element 1, 1a, 1b, 11, 11a, 21, 21a or all the organic electroluminescent elements 1, 1a, 1b, 11, 11a, 21, 21a.

For instance, in the case where the light emitting device 111 is a display device, the driving unit 111b can be configured to apply a current to each organic electroluminescent element 1, 1a, 1b, 11, 11a, 21, 21a.

Alternatively, for instance, in the case where the light emitting device 111 is an illumination device, the driving unit 111b can be configured to apply a current to all the organic electroluminescent elements 1, 1a, 1b, 11, 11a, 21, 21a.

The configuration of driving by the driving unit 111b is not limited to those illustrated, but can be appropriately changed depending on the purpose and the like of the light emitting device 111.

The control unit 111c can be configured to include e.g. a control circuit for controlling the driving unit 111b.

Here, known techniques are applicable to the components other than the aforementioned organic electroluminescent element 1, 1a, 1b, 11, 11a, 21, 21a. Thus, the detailed description on the light emitting unit 111a, the driving unit 111b, and the control unit 111c is omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. An organic electroluminescent element comprising:
   a first electrode;
   a second electrode provided opposite to the first electrode;
   an organic light emitting layer provided between the first electrode and the second electrode; and
   a protrusion provided at least one of between the first electrode and the organic light emitting layer and between the organic light emitting layer and the second electrode; and
   an optical path control layer provided on an opposite side of the first electrode from a side provided with the organic light emitting layer,
   a formula $n_1 \times 0.9 \leq n_2 \leq n_1 \times 1.1$ is satisfied, where $n_2$ is a refractive index of an optical path control layer, and $n_1$ is a refractive index of the organic light emitting layer.

2. The element according to claim 1, wherein the protrusion is shaped so that cross-sectional area in a direction parallel to an extending direction of the first electrode gradually decreases toward a side of the second electrode.

3. The element according to claim 1, wherein a formula $1.4 \leq L_{MAX}/H \leq 4.2$ is satisfied, where $L_{MAX}$ is maximum length of a surface of the protrusion on a side of the first electrode, and H is height of the protrusion.

4. The element according to claim 1, wherein a formula $n_1 \times 0.9 \leq n \leq n_1 \times 1.1$ is satisfied, where n is a refractive index of the protrusion, and $n_1$ is a refractive index of the organic light emitting layer.

5. The element according to claim 1, wherein the protrusion is transmissive to light emitted from the organic light emitting layer.

6. The element according to claim 1, wherein the protrusion is insulative.

7. The element according to claim 1, wherein the protrusion is conductive.

8. The element according to claim 7, wherein conductivity of the protrusion is higher than conductivity of the organic light emitting layer.

9. The element according to claim 1, wherein the protrusion is provided in a plurality, and the plurality of protrusions are spaced from each other.

10. The element according to claim 1, wherein the protrusion includes at least one of $SiN_x$ and a polymer resin.

11. The element according to claim 1, wherein the protrusion includes a polymer resin and a particle having a higher refractive index than a refractive index of the polymer resin.

12. The element according to claim 1, wherein the optical path control layer has a thickness dimension of 1 micrometer (μm) or more and 100 micrometers (μm) or less.

13. The element according to claim 1, wherein the optical path control layer is transmissive to light emitted from the organic light emitting layer.

14. The element according to claim 1, wherein a material of the optical path control layer is a same as a material of the protrusion.

15. A light emitting device comprising:
an organic electroluminescent element including:
  a first electrode;
  a second electrode provided opposite to the first electrode;
  an organic light emitting layer provided between the first electrode and the second electrode;
  a protrusion provided at least one of between the first electrode and the organic light emitting layer and between the organic light emitting layer and the second electrode; and
  an optical path control layer provided on an opposite side of the first electrode from a side provided with the organic light emitting layer,
  a formula $n1 \times 0.9 \leq n2 \leq n1 \times 1.1$ is satisfied, where n2 is a refractive index of an optical path control layer, and n1 is a refractive index of the organic light emitting layer,
a driving unit configured to apply a current to the organic electroluminescent element; and
a control unit configured to control the driving unit.

16. The device according to claim 15, wherein the protrusion is shaped so that cross-sectional area in a direction parallel to an extending direction of the first electrode gradually decreases toward a side of the second electrode.

17. The device according to claim 15, wherein a formula $1.4 \leq L_{MAX}/H \leq 4.2$ is satisfied, where $L_{MAX}$ is maximum length of a surface of the protrusion on a side of the first electrode, and H is height of the protrusion.

18. The device according to claim 15, wherein a formula $n_1 \times 0.9 \leq n \leq n_1 \times 1.1$ is satisfied, where n is a refractive index of the protrusion, and $n_1$ is a refractive index of the organic light emitting layer.

* * * * *